United States Patent [19]

Wadell

[11] Patent Number: 5,572,160

[45] Date of Patent: Nov. 5, 1996

[54] ARCHITECTURE FOR RF SIGNAL AUTOMATIC TEST EQUIPMENT

[75] Inventor: Brian C. Wadell, Reading, Mass.

[73] Assignee: Teradyne, Inc., Boston, Mass.

[21] Appl. No.: 347,633

[22] Filed: Dec. 1, 1994

[51] Int. Cl.$^6$ .................................................. G01N 22/00
[52] U.S. Cl. ........................ 327/427; 324/763; 333/101; 333/109
[58] Field of Search ............................ 327/407; 324/527, 324/763, 601; 333/101, 109

[56] References Cited

U.S. PATENT DOCUMENTS

| | | | |
|---|---|---|---|
| 3,961,273 | 6/1976 | Trush | 328/155 |
| 4,808,912 | 2/1989 | Potter et al. | 324/58 B |
| 4,808,913 | 2/1989 | Grace | 324/58 B |
| 4,816,767 | 3/1989 | Cannon et al. | 324/58 B |
| 4,839,578 | 6/1989 | Roos | 324/58 B |
| 5,276,411 | 1/1994 | Woodin, Jr. et al. | 333/22 R |
| 5,311,440 | 5/1994 | Hess, Jr. | 364/481 |
| 5,371,505 | 12/1994 | Michaels | 342/360 |
| 5,376,938 | 12/1994 | Martinez et al. | 342/128 |
| 5,381,115 | 1/1995 | Timmons et al. | 330/279 |
| 5,434,511 | 7/1995 | Adamian et al. | 324/601 |
| 5,467,021 | 11/1995 | Adamian et al. | 324/601 |
| 5,483,158 | 1/1996 | Van Heteren et al. | 324/318 |
| 5,493,719 | 2/1996 | Smith et al. | 455/325 |

*Primary Examiner*—Timothy P. Callahan
*Assistant Examiner*—T. Lam
*Attorney, Agent, or Firm*—Edmund J. Walsh

[57] ABSTRACT

An RF useful for configuring RF sources and receivers to make a wide range of measurements on a device under test. The module includes a directional element which allows one receiver to measure both the input and the output signals from one test point. In addition, the module allows multiple input signals to be combined for intermodulation testing. Multiple copies of the module are used to construct multiple channels in an RF tester. At least one RF source and one RF receiver can be connected to each channel. Each lead of a device under test is assigned to a channel, but one channel may be multiplexed to more than one lead. Switching circuitry included in each module allows the source from one channel to be used as an intermodulation signal for another channel. The module includes calibration standards for source and receiver level accuracy. With this arrangement, numerous RF measurements, including measurement of s-parameters, can be made on a device under test without dedicated instruments.

12 Claims, 3 Drawing Sheets

ARCHITECTURE FOR RF SIGNAL AUTOMATIC TEST EQUIPMENT

This invention relates generally to automatic test equipment and more specifically to an architecture for providing high frequency test signals to a device under test.

Automatic test equipment (generally a "tester") is used in the manufacture of semiconductor devices. Purely digital devices are usually tested with testers which drive and receive digital signals. Semiconductor devices which process analog as well as digital signals must be tested with testers which can produce and receive analog and digital signals. These signals are called mixed signal testers.

FIG. 1 shows the architecture of a typical prior art mixed signal tester 100. Tester main frame 102 controls the test. It generates test signals and analyzes responses to identify errors during a test.

Tester main frame 102 is connected to the device under test (herein a "DUT") 106 through test head 104. Because one goal of automatic test is to identify faulty components as early as possible in the manufacturing operation, the components are often tested while they are still on the semiconductor wafer. Thus, DUT 106 might be very small, usually a fraction of a square inch.

Test head 104 routes the various test signals needed to test DUT 106 into this small area. Test head 104 also contains electronic circuitry which must be positioned close to DUT 106 to provide good signal integrity.

Tester 100 is controlled by control electronics 108 inside tester main frame 102. Control electronics 108 is a high speed computer. It includes memory (not shown) which can be programmed so that tester 100 can perform numerous tests on a variety of semiconductor devices.

Control electronics 108 is connected over one or more busses 110 to tester subsystems. Tester 100 includes subsystems that process RF signals. RF signals are loosely defined as those signals having frequencies in the range of about 10 MHz up to about 6 GHz. Tester 100 also includes a subsystem that processes lower frequency AC signals, sometimes called base band signals. Tester 100 also contains a subsystem that processes DC signals and another subsystem that processes digital signals.

The RF subsystem is made up of a plurality of RF sources and receivers 112. Each RF source can be programmed to generate a test signal at a frequency and level specified by control electronics 108. Some or all of the RF sources receive a base band signal from the low frequency subsystem over signal path 136. This base band signal is used to modulate the RF signal provided by the source.

Each RF receiver measures power of a received signal over a range of frequencies. The operating parameters of the source and receiver, such as power levels and frequency range, can be controlled by control electronics 108. Some or all of the receivers can also down convert the RF signal to a base band signal which is passed to the low frequency subsystem.

Sometimes, this combination of RF sources and receivers is not sufficient to make the RF measurements on DUT 106 which are required to determine various parameters of the device. In these circumstances, dedicated instruments 120 are added to the RF subsystem. Each of the dedicated instruments 120 generally performs one function, such as vector network analysis. More recently, some dedicated instruments which perform two functions have become available. These instruments often have a standard control interface such as VXI or gpib so that they may be easily incorporated into tester 100.

The low frequency (base band) subsystem is made up of low frequency analog sources and receivers 114. These devices are implemented using digital signal processing technology. A typical system might operate at 200 MHz, allowing waveforms of almost any shape to be produced or analyzed.

The DC subsystem is made up of DC sources and meters 116. These devices can produce or measure DC bias conditions.

The digital subsystem generates and receives digital signals. It is made up of digital drivers and receivers 116.

RF sources and receivers 112, low frequency sources and receivers 114, DC sources and receivers 116, digital sources and receivers 118 and dedicated instruments 120 are all connected to test head 104. In many instances, test head 104 contains distributed instrument electronics 122, which represent portions of the sources or receivers in the RF, low frequency, DC and digital subsystems that must be positioned near DUT 106 for greater accuracy or other reasons.

Connections to the RF sources and receivers 112 and the dedicated instruments 120 are made through RF switching circuitry 134. Each lead (not numbered) of DUT 106 which receives or produces an RF signal is connected to RF switching circuitry 134. To fully test DUT 106, it is usually necessary to run several tests. The RF subsystem must be configured differently for each test. The configuration is created by moving cables and opening and closing switches inside RF switching circuitry 134. These switches operate under control of control electronics 108. These switches are typically implemented with commercially available microwave switches. The switches are configured to allow each source or receiver used to test one lead of DUT 106 to be connected to that lead.

The signals generated by low frequency sources and receivers 114, DC sources and receivers 116 and digital sources and receivers 118 are routed to leads of DUT 106 through interconnect circuitry 132. Where necessary, interconnect circuitry 132 contains switches to make the appropriate connections.

Interconnect circuitry 132 is connected to RF switching circuitry through signal path 138. Signal path 138 allows DC bias conditions to be introduced or measured within the RF subsystem.

To test DUT 106, control electronics 108 executes a program. The program configures tester 100 to make a first measurement by specifying the settings for the instruments 112, 114, 116, 118 and 120 and also the settings for switches in RF switching circuitry 134 and interconnect circuitry 132. The measurement is made and passed back to control electronics 108. Then, tester 100 is reconfigured to take the next measurement. This process is repeated until all the required measurements are taken.

To test a DUT which includes RF circuitry, numerous parameters are measured, such as s-parameters, group delay, phase, noise figure, load pulling, intermodulation distortion, intercept points, 1 dB compression point and phase noise.

The architecture for a tester which measures RF parameters shown in FIG. 1, though more desirable than connecting each instrument to DUT 106 manually, has several disadvantages. Custom RF switching 134 is undesirable for several reasons. First, the instruments used to test a particular semiconductor device will depend on the type of device used. As a result, RF switching circuit 134 must be custom made for each type of device tested. There is a significant cost associated with preparing custom hardware and software needed to control it.

Second, custom calibration routines must be written for RF instruments 112 and 120. RF test instruments normally include software calibration routines. Those routines, however, calibrate the instrument only for tests in which the DUT is connected directly to the instrument. Different calibration routines must be written to account for the switching circuitry between the instrument and DUT 106. Because this switching circuitry is custom built for each type of device to be tested, the calibration routines must also be custom written for the type of device to be tested.

A third disadvantage is that RF switching circuitry 134 is constructed from numerous microwave switches. These switches are generally large, which makes it difficult to place them close to DUT 106. As a result, distributed instrument electronics 122 must be spaced away from DUT 106 further than might be desirable. In addition, the microwave switches are slow to operate, which decreases the number of devices which can be tested in a manufacturing shift. Further, microwave switches are also expensive and unreliable. They are prone to fail or have degraded performance after as little as a few hundred thousand operations.

A further disadvantage with the architecture of FIG. 1 is the cost of dedicated instruments 120. It would be highly desirable if more measurements could be made with the RF sources and receivers 112.

SUMMARY OF THE INVENTION

With the foregoing background in mind, it is an object of the invention to provide a module which can allow an RF source and receiver to be connected to a test point in configurations which allow measurement of many RF parameters.

It is also an object to reduce the number of microwave switches, custom circuitry and custom wiring required in a tester to connect RF instruments to a test point.

It is also an object to reduce the number of dedicated instruments needed to fully test a device containing RF circuitry.

The foregoing and other objects are achieved by a module having a first input connected to an RF source and a second input allowing connection of a second RF source. The module also includes a directional element connected in the signal path from the source. Two ports of the directional element are connected to a receiver through a switch, allowing forward and backwards signals to be measured. Another port of the directional element is connected to the test point through a bias T-circuit, which allows introduction and measurement of DC bias conditions.

In one embodiment of the invention, multiple modules are used in a mixed signal tester which includes a plurality of RF channels. Each channel or a group of a small number of channels has associated with it an RF source and an RF receiver connected to the module. The architecture allows there to be a different number of sources and receivers per channel or group of channels. Each module additionally includes switching elements which allow the source from one channel to be connected as the second RF source in another channel.

In another embodiment of the invention, each module is implemented with solid state elements.

In yet other embodiments of the invention, one or more switches are included in the signal path which can be used to calibrate each source and receiver.

BRIEF DESCRIPTION OF THE DRAWINGS

The invention will be better understood by reference to the following more detailed description and the accompanying drawings in which.

DESCRIPTION OF THE PREFERRED EMBODIMENT

According to the invention, RF switching circuitry 134 is replaced by one or more channel cards. Each channel card contains one or more circuits, called "channels," designed to send and receive RF signals to one lead of DUT 106. Each channel card has an architecture which allows sources and receivers to be connected to the DUT in a large number of ways. The sources and receivers can be connected in ways which allow all standard measurements normally made on RF components to be made without the addition of dedicated instruments. Thus, by using the channel card of the invention, dedicated instruments 120 can be eliminated.

Figure 2A:
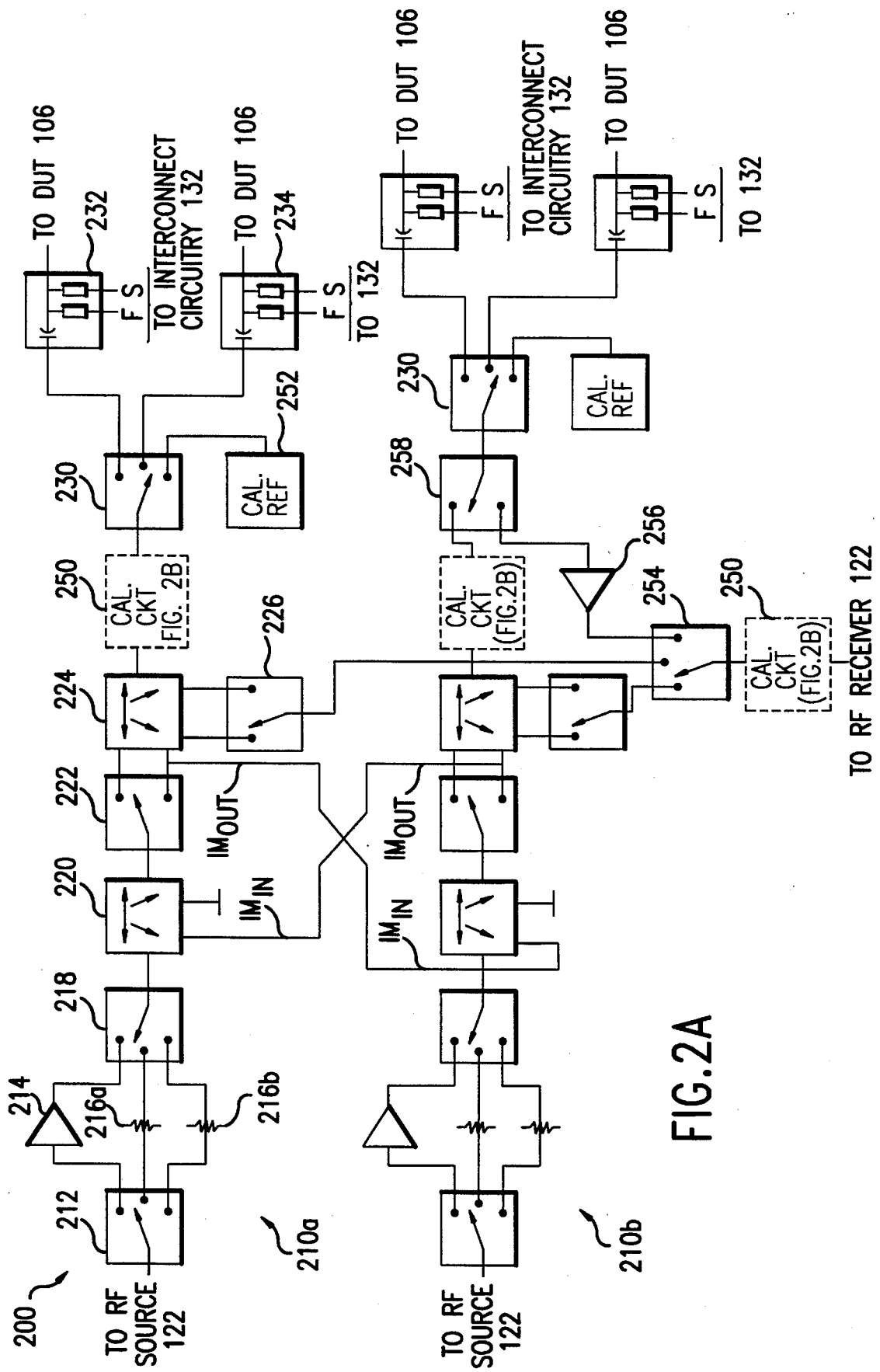
FIG. 2A is a schematic diagram of an RF module according to the; invention.

Turning now to FIG. 2A, a schematic of a channel card 200 is shown. Preferably, there are at least two channels 210a and 210b on each channel card 200 to allow easy interaction between the channels. The channels could be identical. However, in the preferred embodiment, channel 210a is optimized for receiving high powered signals and channel 210b is optimized for receiving low power signals.

Each channel 210 includes a switch 212 having an input connected to an RF source as is conventionally used to test RF devices. Switch 212 allows the signal from the source to be switched to amplifier 214, pad 216A or pad 216B. Pads 216 attenuate the signal, with 216A and 216B providing different amounts of attenuation. In this way, the dynamic range of the source can be greatly expanded, allowing one source to provide signals needed to make both high power and low power measurements.

The outputs of amplifier 214 and pad 216 are passed to switch 218. Switch 218 is normally used ganged with switch 212 to complete the path through either amplifier 214 or pad 216. However, switches 212 and 218 may operate independently to perform such functions as isolating the source.

The output of switch 218 is coupled to the input port of directional element 220. A directional element is a device having at least three ports. One port is defined as the input and one port is defined as the output. These ports define a "through path" as a signal applied to the input will propagate to the output. However, it should be appreciated that the denotation of a port as an input or an output is purely semantic because a signal applied to the output will also propagate to the input. Additional ports are usually named with a direction. These ports can be denoted either "forward" or "reverse" ports, though sometimes a forward port is called a "coupled" port and a reverse port is called an isolated port. A signal applied to the input is coupled to the forward port, but not to the reverse port. A signal applied to the output is coupled to the reverse port, but not to the forward port. The converse is also true: a signal applied to the forward port is coupled to the input but not the output and a signal applied to the reverse port is coupled to the output but not to the input.

Directional elements having three ports are commercially available and are usually called directional couplers. If a four port directional element can not be found commercially, it can be implemented by configuring two identical directional couplers in a back to back fashion, i.e., the output ports of the couplers are connected together and the input of one becomes the output of the directional element.

Directional element 220 preferably has four ports: an input, an output, a forward and a reverse port (not numbered). The reverse port of directional element 220, denoted $IM_{in}$, receives a signal from point $IM_{out}$ on adjacent channel 210b. Thus the signal out of switch 218 and the signal from adjacent channel 210b, if any, are both coupled to the output port of directional element 220. When both signals are applied, the signal out of the right port of directional element 220 is the sum of the two signals.

The output port of directional element 220 is connected to switch 222. Switch 222 has one position which allows the signal out of switch 218 to be coupled either to the $IM_{out}$ point of channel 210a or on to DUT 106 through the remaining elements of channel 210a.

One output position of switch 222 is connected to the input port of directional element 224. The output port of directional element 224 is connected to switch 230, allowing the signals from the source connected to channel 210a to be coupled through.

The forward port of directional element 224 is connected to switch 226. Likewise, the reverse port of directional element 224 is connected to switch 226. Switch 226 selects between these two inputs. In this way, switch 226 selects either the signal going out to DUT 106 through channel 210a or the signal coming back from DUT 106 through channel 210a. The output of switch 226 is coupled, through switch 254, to an RF receiver. In this way, either the signal applied to or received from DUT 106 to be measured. The RF receiver is a conventionally available receiver. Preferably, a dsp-based receiver is used.

As shown in FIG. 2A, switch 230 connects to a plurality of bias-T elements 232 and 234. Each of the bias-T elements 232 and 234 is connected to one lead on DUT 106. Thus, switch 230 selects which of the leads on DUT 106 is connected to channel 210a. Often, not every RF lead on a DUT needs to be simultaneously connected to a source or receiver for every test on the DUT. By multiplexing the channels, the total number of sources or receivers provided in tester 100 can be less than the total number of RF pins on DUT 106. Connections from bias-T elements to the leads of DUT 106 are made according to a conventional method.

Figure 1:
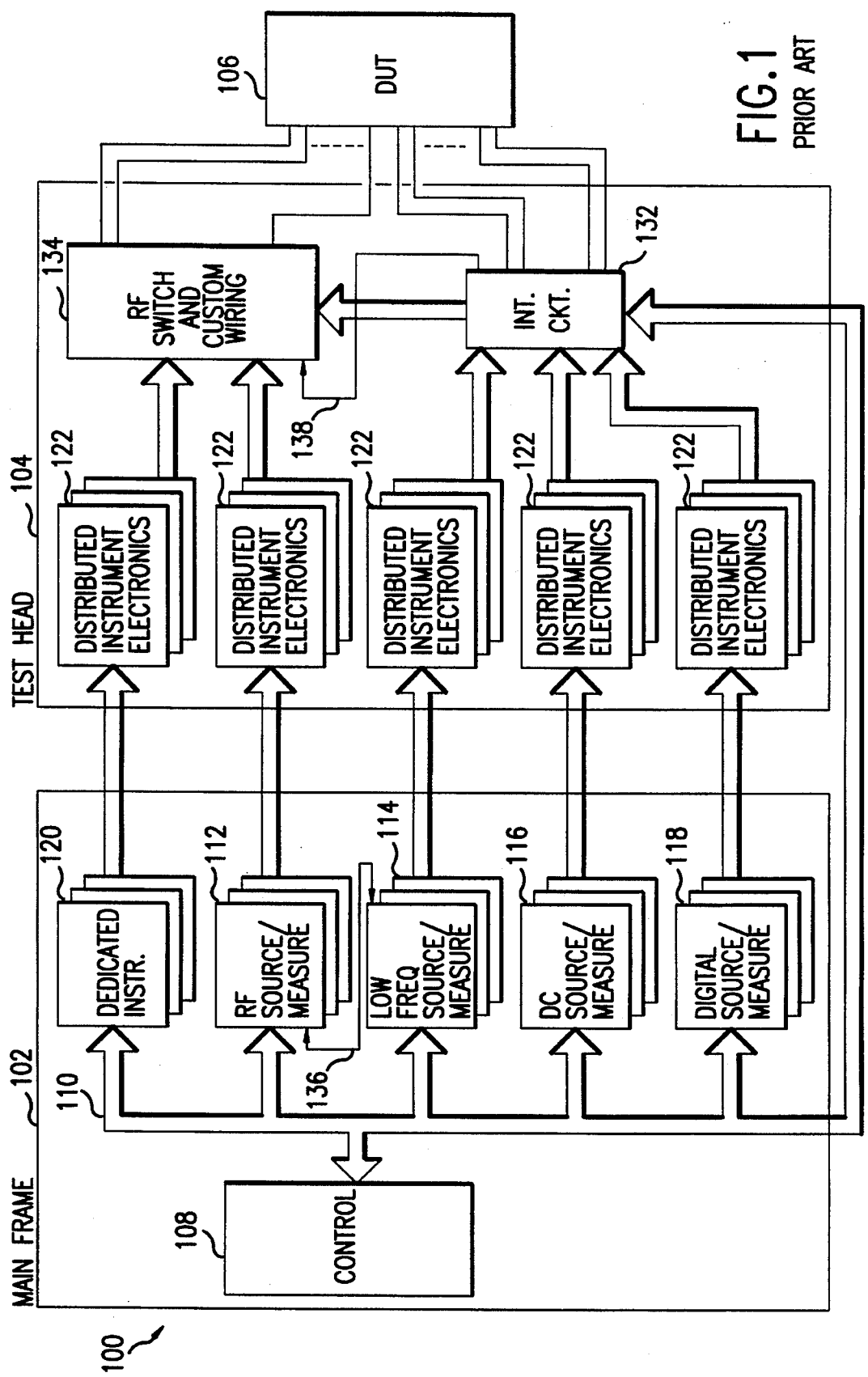
FIG. 1 is a block diagram of a mixed signal tester which could employ the invention.

Each of the bias-T elements 232 and 234 has F and S terminals connected to interconnect circuitry 132 (FIG. 1). Through these connections, DC bias signals can be added to the signals applied to DUT 106 or the DC bias on signals coming from DUT 106 can be measured. To add a DC bias, a DC signal is applied to the F, or force, terminal. The level of the DC bias is measured at the S terminal. Because the actual DC bias level introduced will be influenced by the amount of current flow as well as the resistance between the DC source and DUT 106, the actual level of the DC bias is measured at the S terminal so that the input level may be precisely adjusted. To measure the DC level of a signal when no DC bias is being added, the measurement may be made at either the F or S terminal.

Each of the bias-T elements 232 and 234 is actually implemented by two bias-T circuits, one for the F and one for the S terminals. However, the S terminal is only needed for more accurate feedback control in applying a DC signal and is therefore optional.

Channel 210b is preferably identical to channel 210a, with a few exceptions. The embodiment of FIG. 2A shows a low noise amplifier 256 and switch 258 added to channel 210b. These additional elements allow channel 210b to measure lower power signals. To measure such a signal, switch 258 is activated to connect the input of low noise amplifier 256 to DUT 106 through switch 230. Switch 254 is actuated to connect the output of low noise amplifier 256 to an RF receiver. In this way, a signal can be amplified prior to presentation to the RF receiver without passing it through a directional coupler, thereby avoiding the signal losses associated with the directional coupler.

Channel card 200 also contains circuitry to aid in the calibration of both the sources and receivers. Calibration references 252 are included. They may be connected to the either a source or receiver through switch 252. Calibration of microwave devices is conventionally accomplished by connecting the device to a series of reference standards known as short (ρ1), open (ρ2), load (ρ3), and through (reciprocal). Calibration reference circuit 252 contains these standards and switching circuitry which allows any one of them to be connected to switch 230.

Further calibration is also often needed because of a phenomenon known as "temperature drift." Many microwave elements have an attenuation or gain which is a function of temperature. This causes changes in the signals generated or measured as the temperature changes. It is desirable to make a test unit which always generates the same signals and always reports the same results. To calibrate for temperature drift, channel card optionally includes calibration circuit 250. One calibration circuit 250 might be included following directional element 224 in each channel 210a and 210b. Alternatively, one calibration circuit 250 might be included in the path to an RF receiver following switch 254. This latter arrangement allows the same calibration circuit to be used for both channels.

Figure 2B:
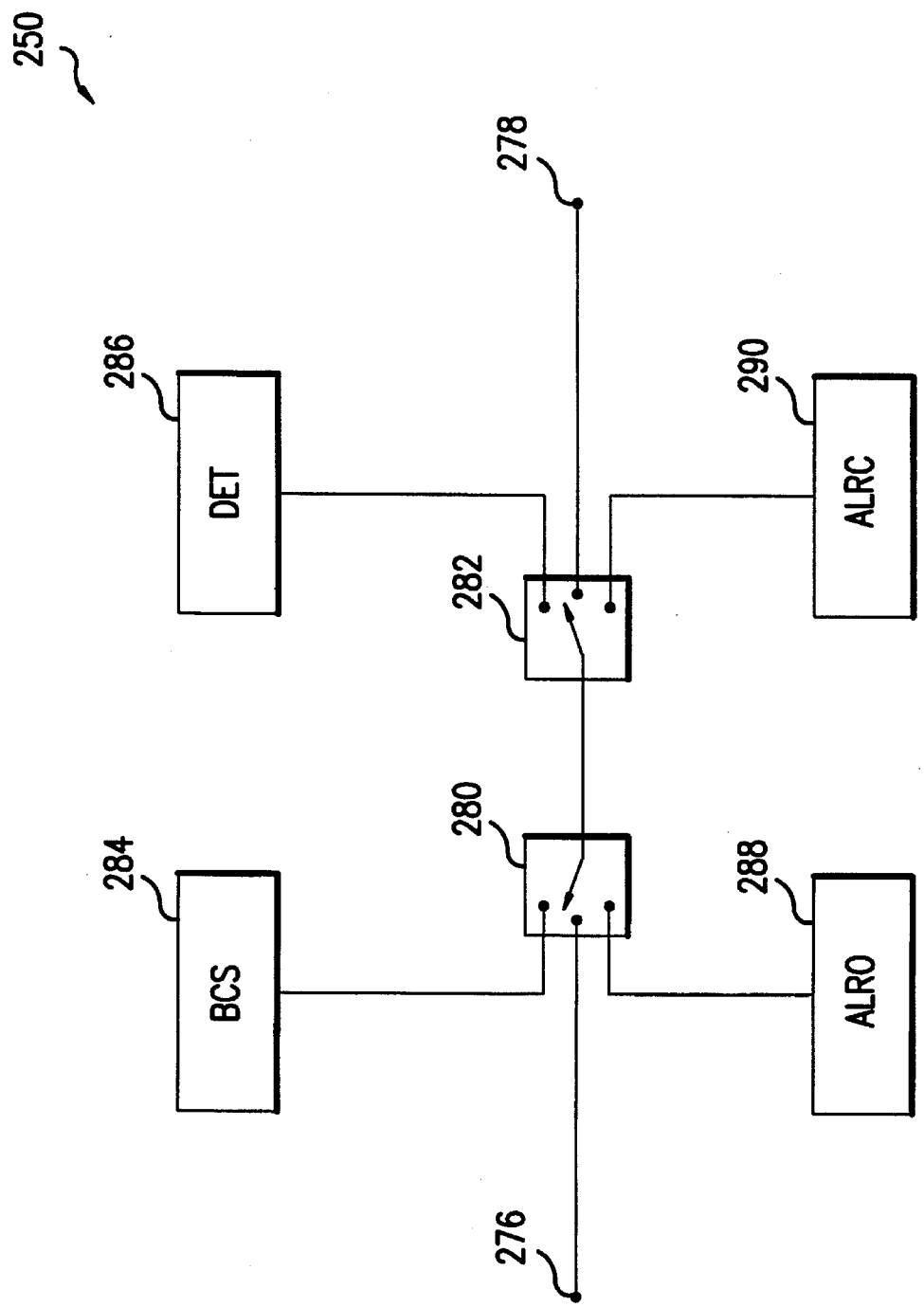
FIG. 2B is a schematic diagram of the calibration module used in the RF module of FIG. 2A.

FIG. 2B shows calibration circuit 250 in greater detail. Calibration circuit 250 includes a pair of switches 280 and 282. A signal applied to terminal 276 can, by activation of switches 280 and 282, be passed directly through to terminal 278. Switches 278 and 280 are set in these positions when calibration circuit 250 is not being used for calibration.

Terminal 278 is coupled to the receiver side of the signal path and terminal 276 is connected to the source side. To calibrate the source, switches 280 and 282 are first actuated to connect ALRO 288 to DET 286.

DET 286 is a detector which produces a uniform response at all frequencies of interest regardless of the temperature. Such a detector is said to be "flat over frequency." The actual magnitude of the output may vary as a function of temperature. Thus, DET 286 could be described by the function $V_o=\alpha(T)V_i$, where $V_o$ is the output level, $\alpha(T)$ is some value which varies as a function of temperature and $V_i$ is the input level. To calibrate the source, it is necessary to determine $\alpha(T)$.

To determine $\alpha(T)$, ALRO 288 is connected to DET 286 through switches 280 and 282. ALRO 288 is a source that is "constant power over temperature" at one frequency, (i.e. an oscillator). In other words, it produces an output signal of known amplitude at that one frequency regardless of the temperature. To calibrate the source, the output of ALRO 288 is measured by DET 286. This measurement gives a reliable measurement of $V_o$ for a known $V_i$, allowing calculation of $\alpha(T)$.

The source signal is then set to the same frequency as ALRO 288 and connected to DET 286 through switched 280 and 282. $V_i$ of the source is then adjusted until DET 286 has the same output as when measuring the value of ALRO 288.

Even though $\alpha(T)$ is measured at only one frequency, it has essentially the same value for all frequencies. The input frequency of the source is varied over its operating range. At each frequency, the source is adjusted until DET 286 measures the same level as produced when measuring the signal from ALRO 288. Commercially available RF sources include calibration mechanisms which allow this type of adjustment. These steps are directed under the control of control electronics 108 (FIG. 1).

To calibrate a receiver, switch 282 is set to its middle position. Switch 282 is actuated to connect to ALRC 288. ALRC 288 is an absolute level reference comparator, such as might be implemented with a sampling comparator. It indicates when an input signal has a specified level. It is accurate at one frequency, regardless of temperature.

Switch 280 is actuated to connect to BCS 284. BCS 284 is a perfectly flat signal source, such as might be implemented with a noise diode. BCS 284 is flat over frequency, but its output may vary with temperature.

ALRC 290 measures the level of the signal produced by BCS 284. This measurement gives a true value for the level of BCS 284.

Switch 282 is then actuated to connect to port 278. The signal from BCS 284 is thus connected to the receiver. The signal is measured at various frequencies over the range of operation of the receiver. At each frequency, the output of the receiver is compared to the true value of the signal produced by BCS 284. The receiver is adjusted until it indicates that the received value corresponds to the level produced by BCS 284.

The switching and control which are necessary for calibration are controlled by control electronics 108 (FIG. 1). Commercially available receivers respond to commands, such as might be issued by controller 108, to make internal adjustments for calibration.

It will be appreciated that it is very difficult to make a receiver or a source which is flat over both frequency and power level. Design techniques are available to make a source or receiver flat with respect to one or the other, but not both simultaneously and are employed in making or selecting the sources and receivers for calibration. Examples of suitable elements are given above, but any number of alternative designs might be employed.

The exact configuration for calibration circuit 250 shown in FIG. 2B is suitable for use when the calibration circuit is connected between switch 254 and the receiver. If calibration circuit 250 is connected between directional element 250 and switch 230, both the source and receiver are coupled to port 276 (FIG. 2B). To allow the proper connections to be made in this configuration, it is necessary that the positions of BCS 284 and ALRC 290 be reversed. The operation is otherwise the same.

Calibration circuit 250 is useful for calibrating the sources and receivers. Calibration reference 252 is also included to enable module 200 to be calibrated for vector network analysis (VNA) measurements. The measurements made for VNA analysis require that signals be passed through a directional element so that forward and reverse signals can be separately measured. Ideally, a signal applied at the input is coupled to the output and the forward ports and is perfectly isolated from the reverse port. It is impossible to construct a perfect directional element. To compensate for the imperfections, calibration references are used.

An imperfect directional element can be mathematically described by a set of equations. For example, the signal at the forward port could be described as a linear combination of the input and output signals. The signal at the reverse port could be described as a different linear combination of the same signals.

The calibration references 252 allow different impedances to be applied to the directional elements. The signals at the forward and reverse ports can then be measured. These measurements provide sufficient data to solve the set of equations describing the directional element. Various techniques are known for solving these equations are known. However, once solved, it is possible to mathematically compensate for the imperfections of the directional element. The compensation is performed by programming control electronics 108.

It is desirable that the calibration of the directional elements account for all error sources in the signal path. For that reason, the calibration references are normally attached at the point where the measurement circuitry is connected to the device under test. It should be noted in FIG. 2A, though, that the calibration references are internal to module 200.

Having calibration references 252 internal to module 200 eliminates the need to connect references to the delicate leads used to make contact to DUT 106 or to make contact to the signal paths within test head 104. It is, however, possible to compensate for all sources of error in the signal paths to DUT 106 using external impedance standards and software programming of control electronics 108.

To make this compensation, external references are connected as close to the end of the signal paths as possible. The external references are the same calibration references as found in calibration references 252. This connection need only be made once. For example, it might be made at the factory where tester 100 is manufactured.

With external calibration references connected, the standard VNA calibration routine is performed. Then, the same VNA calibration measurements are repeated with switch 230 actuated to connect to calibration references 252. By comparing the measurements made with the external calibration references to those made with the internal calibration references, it is possible to compute adjustments for the internal references. These adjustments are stored in tester 100 in any convenient non-volatile storage medium.

Thereafter, whenever a VNA calibration routine is performed using calibration references 252, the measurements are adjusted by the stored amount. In this way, the internal calibration references act the same as external references.

Switches 212, 218, 222, 226, 228, 230, 254 and 258 all have control inputs which are not explicitly shown. Those control inputs are connected to control electronics 108 (FIG. 1). In that way, channel 210a can be configured for tests as required by test programs running on control electronics 108. Also, items normally incorporated in RF circuitry as a matter of good design practice are not shown explicitly in FIG. 2. Some examples of the items which might be included according to routine design practice are power connections, bias elements and shielding.

The elements depicted in FIG. 2 are standard elements used to construct RF circuitry. Preferably, these are solid state components integrated onto a printed circuit board using MMIC fabrication techniques. The circuit elements required for such a circuit can be purchased from commercial sources. Good design practices should be employed in the selection of these components. For example, impedances should be matched to reduce reflections.

With the module depicted in FIG. 2A, it is possible to make many kinds of measurements on DUT 106. For example, the gain of a device may be measured by configuring channel 210a to drive the input lead of a DUT with a signal from the source connected to channel 210a. Channel 210b could be simultaneously configured to measure the signal at the output lead of the device.

As another example of the flexibility of the channel card depicted in FIG. 2A, a tester constructed with the invention might be used to test a part known as a 2092 Power Amplifier/Low Noise Amplifier With T/R Switch. Such a part has two RF input/outputs and digital control inputs. It is designed to amplify the signal at one input/output through an internal power amplifier when the digital controls take on a first value. When the digital controls take on another value, the part amplifies the signal at the other input/output through a low noise amplifier. Such a part might, for example, be used in the transmit/receive portion of a cellular telephone.

To test such a part, it would be desirable to measure the input and output impedances of the two ports. These measurements are normally made by connecting a vector network analyzer (VNA) to the part. It would also be desirable to measure gain, harmonics and intercept points. These measurements are traditionally made by connecting a spectrum analyzer and signal generator to the part. It is also desirable to test the noise figure. This measurement is normally made by connecting a noise figure meter to the device.

With the invention, all of these measurements can be made by connecting one of the channels 210a to one of the RF inputs of the part and channel 210b to the other input. All of these measurements can then be made with the tester without the need for a custom switch network or to manually connect and disconnect instruments.

Having described a preferred embodiment of the invention, various alternative embodiments might be constructed. For example, the preferred embodiment incorporated a module according to the invention into an RF channel of a mixed signal tester. The invention need not be so limited and might be used anywhere multiple RF measurements must be performed at the same point.

In addition, various elements are described as being connected together and are shown to be directly connected together. The invention is not so limited. For example, any of the elements shown to be directly connected together could be connected together through switches, amplifiers, attenuators, directional elements or other circuit elements.

It was described that directional elements are implemented using passive components. Active components could be used as well. Also, it was described that a four port directional element could be constructed from two back to back directional couplers. Similar functionality could be achieved by a splitter in series with a directional coupler. With this arrangement of elements, the input port would be the input of the splitter. The forward port would be one leg of the splitter. The second leg of the splitter would be connected to the input of the directional coupler. The output of the directional coupler would be the output of the four port directional element and the coupled output of the directional coupler would be the reverse port of the four port directional element.

Also, it was described that the preferred embodiment employed solid state elements. While the architecture of the invention lends itself well to implementation with solid state components because the connections between the elements never need to be customized, use of solid state elements is not essential to the invention. Traditional microwave switching elements might be used instead. Such might be the case for testing high power parts.

Further, the preferred embodiment incorporated switch 212 which allowed an input signal to be switched between one of three paths with different gains. The number of such paths need not be limited to three. Where tests will not be conducted over a wide range of power levels, multiple paths are not required. Conversely, where tests will be conducted over a wide range of power levels, more than three paths, each having a different gain or attenuation, might be used.

Likewise, where a single amplifier is shown, multiple amplifiers might be used to provide multiple choices as to the gain. Alternatively, the amplifiers or attenuators might be connected in series to provide stages of gain or attenuation.

In a similar fashion, switch 230 multiplexes one channel between only two leads on DUT 106. Though multiplexing provides the advantage of reducing the number of sources and receivers required, it need not be used. Conversely, it might be desirable in some instances to multiplex each channel among more than two leads on DUT 106. In those instances, switch 230 would have more than two output contacts.

The preferred embodiment shows two channels implemented on one channel card. Having two channels on one card facilitates 2-port s-parameter measurements and allows two sources to be easily connected to the same channel for intermodulation testing. Similar connections could be made even if the channels were physically located on separate cards. Likewise, the same interconnection could be achieved even if more than two channels are implemented on one board. Alternatively, a single channel might be used for 1 port devices.

The preferred embodiment shows that the signal from one channel may be added to the signal in another channel through directional element 220. The module of the invention could be configured to sum any number of signals.

The number of receivers for each channel card or module might be varied. Separate receivers might be used for each channel. Moreover, the preferred embodiment multiplexes one receiver to measure both forward and reverse signals. Two separate receivers might be used.

Also, the preferred embodiment showed that channel 210b is configured to measure low level signals. Both channels could be the same. Alternatively, one channel could be configured with a high power amplifier in place of amplifier 214 or one channel might be configured with additional attenuation for high power measurements.

Also, it was described that conventional RF sources and receivers are used to implement a test. It is not necessary that all sources or receivers be of the same type or that all sources or receivers be of a conventional type. It should be appreciated that the term "source" as used herein could equally well apply to any element which emits an RF signal. Likewise, the term "receiver" could equally well apply to any device which produces some output based on an RF signal applied to it. Although a dsp-based receiver was identified as preferred because it allows measurement of phase, such a receiver is not required, especially if reduced functionality is acceptable.

It should also be appreciated that FIG. 2A shows a particular switching arrangement. It is possible to route the source and receive signals through the module of FIG. 2A with other arrangements.

Further, FIG. 1 shows a block diagram of a full featured mixed signal tester. It tests RF and digital components. However, the invention may be used in conjunction with any system which operates on RF signals. For example, it could be used with a "rack" type system, which includes a much less formal arrangement within main frame 102.

Also, a well designed full featured mixed signal tester includes a relatively large test head because of the desire to keep certain electronics as close as possible to the device under test. The "test head" need not be a large structure. It could be a very simple structure containing little more than a mechanism to attach to the device under test. Also, though it is desirable to have the RF switching as close to the device under test as possible, it is not necessary that it be located within a test head.

It should also be appreciated that the elements shown in FIG. 2 define signal paths to and from a device under test. In many instances, the order in which electronic elements appear in the signal paths is not important. For example, the block of elements made up of switches 212 and 218, amplifier 214 and pad 216 which expands the dynamic range of an input signal could be used at other points in the signal path. For example, it could appear after switch 222.

It should also be appreciated that not all of the features disclosed in the preferred embodiment are required to obtain the benefits of the invention. For example, switch 228 is included only to allow calibration. The invention may be employed without calibration where reduced accuracy is acceptable or alternative calibration methods might be employed.

As another example, the preferred embodiment includes calibration circuitry for both the sources and receivers. Calibration circuitry is not necessary in applications where lower accuracy can be tolerated or in circuits in which very high quality components which do not need calibration are used. In some systems, calibration circuitry might be included for sources only, for receivers only, for both or for neither.

Likewise, directional element 220 and switch 222 are included to allow generation of intermodulation signals. It is not necessary in order to obtain the benefits of the invention that a channel provide intermodulation signals. Alternatively, only a portion of the channels included in a tester might be equipped to produce intermodulation signals.

Accordingly, the invention should be limited only by the spirit and scope of the appended claims.

What is claimed is:

1. RF circuitry apparatus comprising:
   a) a first channel and a second channel, each comprising:
      i) a first directional element having at least two of a first type of ports and at least two of a second type of ports wherein a signal applied as an input to one type of port appears as an output on ports of the other type;
      ii) an RF source coupled to a first type of port of the directional element;
      iii) a first switch having at least two input ports and an output port which is switchably coupled to one of the input ports, a first one of said input ports being coupled to a first type of port of the directional element and a second one of said input ports being coupled to a second type of port of the directional element;
   b) at least one receiver connectable to the output port of the first switch in the first channel and the second channel.

2. The RF circuitry apparatus of claim 1 additionally comprising a bias-T network coupled to one of the second type of ports of the directional element in each of the first channel and the second channel.

3. The RF circuitry apparatus of claim 2 additionally comprising a multiplexing switch and at least one additional bias-T network coupled to said one of the second type of ports of the directional element in each of the first channel and the second channel wherein the bias-T networks are coupled to the directional element through the multiplexing switch.

4. The RF circuitry apparatus of claim 3:
   a) additionally comprising, in each of the first and second channels a second directional element having at least two of a first type of ports and at least one of a second type of port wherein a signal applied as an input to one type of port appears as an output on ports of the other type; and
   b) wherein:
      i) the RF source is coupled to the first directional element through the second directional element in each of the first channel and the second channel, and
      ii) a port of said first type of ports of the second directional element in the first channel is switchably connected to a port of said second type of ports of the second directional element in the second channel.

5. The RF circuitry apparatus of claim 4 additionally comprising at least an amplifier and an attenuator switchably connected in a signal path between the RF source and the second directional element in at least one of the first channel or the second channel.

6. The RF circuitry apparatus of claim 5 wherein the first directional elements and the second directional element of both of the first channel and the second channel are fabricated on one printed circuit board.

7. An RF switching module having at least two channels each of the channels comprising:
   a) a first bi-directional means for directing a test signal to outputs or to a receiver and directing a response signal from said outputs to said receiver; and;
   b) a second bi-directional means coupled to said first bi-directional means, for selectively coupling signals between the channels to form intermodulation signals in at least one of the channels.

8. The RF switching module of claim 7 additionally comprising means responsive to the first bi-directional means for multiplexing the test signal between said outputs in each of the at least two channels.

9. The RF switching module of claim 8 additionally comprising means coupled to said first bi-directional means for DC biasing the test signal in each of the at least two channels.

10. The RF switching module of claim 9 wherein the means for DC biasing comprises means for independently biasing the test signal multiplexed to said outputs.

11. The RF switching module of claim 7 wherein the first bi-directional means for directing said test signal to said outputs comprises means for multiplexing said test signal to outputs.

12. The RF module of claim 7 wherein the first bi-directional means for directing said response signal comprises means for selectively directing said response signal from any of the at least two channels to the receiver.

* * * * *